US007408290B2

(12) United States Patent
May et al.

(10) Patent No.: US 7,408,290 B2
(45) Date of Patent: Aug. 5, 2008

(54) POWER DRIVING CIRCUIT FOR CONTROLLING A VARIABLE LOAD ULTRASONIC TRANSDUCER

(75) Inventors: Jason May, Memphis, TN (US); Charles I. Richman, Reno, NV (US); Rudolf W. Gunnerman, Reno, NV (US)

(73) Assignee: SulphCo, Inc., Houston, TX (US)

( * ) Notice: Subject to any disclaimer, the term of this patent is extended or adjusted under 35 U.S.C. 154(b) by 298 days.

(21) Appl. No.: 11/069,492

(22) Filed: Feb. 28, 2005

(65) Prior Publication Data

US 2006/0238068 A1 Oct. 26, 2006

(51) Int. Cl.
*H02N 2/00* (2006.01)
*H01L 41/08* (2006.01)

(52) U.S. Cl. .................. 310/334; 310/314; 310/316.01; 310/316.03; 310/317; 310/323.19

(58) Field of Classification Search ................ 310/334, 310/316.03, 314, 317, 323.19
See application file for complete search history.

(56) References Cited

U.S. PATENT DOCUMENTS 6,897,628 B2 * 5/2005 Gunnerman et al. ........ 318/118
7,211,928 B2 * 5/2007 Puskas ........................ 310/317
2004/0227414 A1 * 11/2004 Gunnerman et al. .......... 310/26
2005/0017599 A1 * 1/2005 Puskas ........................ 310/317
2006/0101919 A1 * 5/2006 Gunnerman et al. .......... 73/643
2006/0196915 A1 * 9/2006 Gunnerman ............. 228/110.1
2006/0238068 A1 * 10/2006 May et al. .................... 310/314
2006/0260405 A1 * 11/2006 Gunnerman et al. .......... 73/643

* cited by examiner

*Primary Examiner*—Jaydi A San Martin
(74) *Attorney, Agent, or Firm*—Townsend and Townsend and Crew LLP

(57) ABSTRACT

The present invention is directed to a high-powered (e.g., >500 W) ultrasonic generator for use especially for delivering high-power ultrasonic energy to a varying load including compressible fluids. The generator includes a variable frequency triangular waveform generator coupled with pulse width modulators. The output from the pulse width modulator is coupled with the gates of an Isolated Gate Bipolar Transistor (IGBT), which amplifies the signal and delivers it to a coil that is used to drive a magnetostrictive transducer. In one embodiment, high voltage of 0-600 VDC is delivered across the collector and emitter of the IGBT after the signal is delivered. The output of the IGBT is a square waveform with a voltage of +/−600V. This voltage is sent to a coil wound around the ultrasonic transducer. The voltage creates a magnetic field on the transducer and the magnetorestrictive properties of the transducer cause the transducer to vibrate as a result of the magnetic field. The use of the IGBT as the amplifying device obviates the need for a Silicon Controlled Rectifier (SCR) circuit, which is typically used in low powered ultrasonic transducers, and which would get overheated and fail in such a high-powered and load-varying application.

10 Claims, 4 Drawing Sheets

POWER DRIVING CIRCUIT FOR CONTROLLING A VARIABLE LOAD ULTRASONIC TRANSDUCER

BACKGROUND OF THE INVENTION

The present invention relates, in general, to ultrasonic systems and, in particular, to methods and circuitry for driving a high-power ultrasonic transducer for use with a varying load.

Ultrasound technology is utilized in a variety of applications from machining and cleaning of jewelry, performing surgical operations to the processing of fluids, including hydrocarbons. The basic concept of ultrasonic systems involves the conversion of high frequency electric energy into ultrasonic frequency mechanical vibrations using transducer elements. Such systems typically include a driver circuit that generates electrical signals which excite a piezoelectric (or magnetostrictive) transducer assembly. A transmission element such as a probe connects to the transducer assembly and is used to deliver mechanical energy to the target.

Ultrasonic transducers include industrial and medical resonators. Industrial resonators deliver high energy density in order to substantially affect the materials with which they are in contact. Common uses of industrial resonators include welding of plastics and nonferrous metals, cleaning, abrasive machining of hard materials, cutting, enhancement of chemical reactions (sonochemistry), liquid processing, defoaming, and atomization. Usual frequencies for such operations are between 15 kHz and 40 kHz, although frequencies can range as low as 10 kHz and as high as 100+ kHz. Medical resonators include devices for cutting, disintegrating, cauterizing, scraping, cavitating, dental descaling, etc.

A transducer assembly for an industrial ultrasonic application may be referred to as an industrial ultrasonic stack, and may include a probe (or a sonotrode, or a horn), a booster, and a transducer (or a converter). The probe contacts the load and delivers power to the load. The probe's shape depends on the shape of the load and the required gain. Probes are typically made of titanium, aluminum, and steel. The booster adjusts the vibrational output from the transducer and transfers the ultrasonic energy to the probe. The booster also generally provides a method for mounting the ultrasonic stack to a support structure. The active elements are usually piezoelectric ceramics although magnetostrictive materials are also used.

Existing technology for driving ultrasonic probes has been developed for driving a system at one desired frequency and power level for a specific process. This known technology utilizes an electrical system based on a Silicon Controlled Rectifier (SCR). Typically, SCR's require a forced turn off system having a particular capacitor value to control and turn off the SCR which in turn limits the operating frequency of the electrical system. Also, the SCR systems are limited to much lower power levels which do not allow for the effective control of an ultrasonic probe at higher power levels. As used herein, a high power level refers to power levels of at least 500 Watts. For example, the SCR-based ultrasonic generators drive ultrasonic probes which are designed for a specific load such as molten steel. However, an SCR-based ultrasonic generator when used in a process which exposes an attached ultrasonic probe to varying load conditions, such as the processing of liquid hydrocarbons, limits the effectiveness of the probe in different liquids. This limited effectiveness is due to the loading effect different liquids will have on the ultrasonic probe. In addition, even for a given liquid, density and phase change effects can vary the loading on the ultrasonic probe.

There is therefore a need for a high-power and variable load driving circuit for an ultrasonic generator that does not suffer from the shortcomings of SCR-based ultrasonic generators.

BRIEF SUMMARY OF THE INVENTION

The present invention provides an ultrasonic generator for driving a dynamic ultrasonic probe system for use with variable loads, at operating frequencies of up to 20 kHz and power levels of up to 60 kW. The system utilizes a Full Bridge Isolated Gate Bipolar Transistor (IGBT) system to drive ultrasonic probes at a resonant frequency at different and adjustable voltage, frequency, and current levels. As an ultrasonic probe experiences different loads the electrical power requirements will change. For example, during various hydrocarbon processing (e.g., desulfurization) techniques, such as those patented by the assignee herein, many different and varying loads are seen by an ultrasonic transducer as different fluids (e.g., such as different types of crude oils, diesel fuels, etc.) are processed. Various patented hydrocarbon processing techniques which are patented by the assignee herein are disclosed in U.S. Pat. Nos. 6,827,844; 6,500,219 and 6,402,939, the disclosures of which are hereby incorporated by reference herein. By using a system such as the Full Bridge IGBT based system, in accordance with the embodiments of the present invention, one can control the required variables such as frequency, voltage and current to effectively manage the performance of the ultrasonic probe for varying loads. The varying loads typically include different compressible and incompressible hydrocarbon fluids.

In one aspect, the embodiments of the present invention are directed to a high-powered (e.g., >500 W) ultrasonic generator for delivering high-power ultrasonic energy to a varying load. In one embodiment, the ultrasonic generator includes a variable frequency triangular waveform generator coupled with a pulse width modulator. The output from the pulse width modulator is coupled with the gates of an IGBT, which amplifies the signal and delivers it to a coil that is used to drive a magnetostrictive transducer. In one embodiment, high voltage of 0-600 VDC is delivered across the collector and emitter of the IGBT after the signal is delivered. The output of the IGBT is then a square waveform with a voltage of +/−600V. This voltage is sent to a coil wound around the ultrasonic transducer. The voltage creates a magnetic field on the transducer and the magnetostrictive properties of the transducer cause the transducer to vibrate as a result of the magnetic field. The use of the IGBT as the amplifying device obviates the need for a SCR circuit, which is typically used in low powered ultrasonic transducers, and which would get overheated and fail in such a high-powered and load-varying application.

For a further understanding of the nature and advantages of the invention, reference should be made to the following description taken in conjunction with the accompanying drawings.

DETAILED DESCRIPTION OF THE INVENTION

Figure 1:
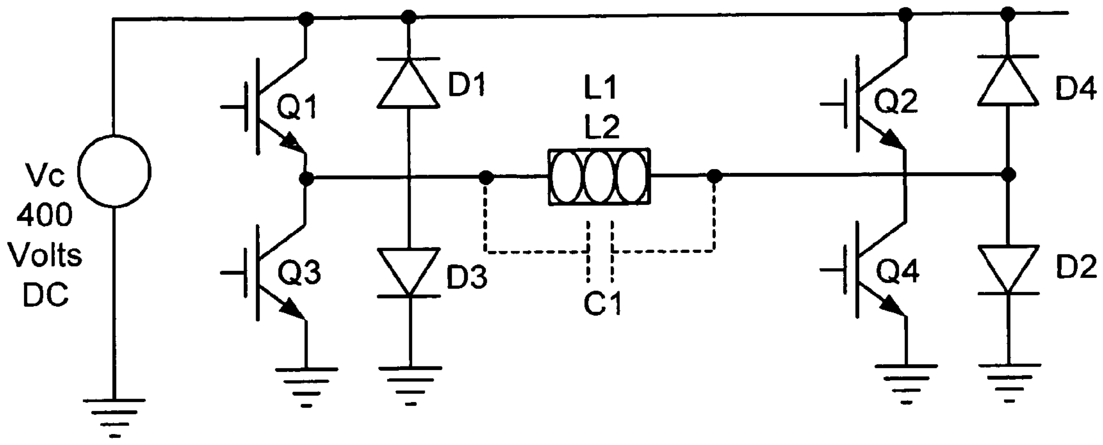
FIG. 1 is a simplified circuit diagram showing a model of a full bridge IGBT circuit with a parallel resonant magneto-constrictive transducer according to one embodiment of the present invention.

Prior to the invention of the present ultrasonic generator, the prior art ultrasonic generators relied on Silicon Controlled Rectifier ("SCR") technology. In these generators, the SCRs pulse current through an ultrasonic probe at a frequency of about 17.5 kHz. At this fast switching frequency, the SCRs can easily become overheated and fail. To address this overheating problem, the SCRs require a forced turn off system commonly know in the field of power electronics as "Forced Commutation." This means that when a signal is delivered to the system to turn on the SCR, it will remain on for a specified amount of time after that signal is turned off. It is possible through forced commutation to make the SCR turn off faster. This forced commutation is required for a faster switching frequency of 17.5 kHz. Often due to this process the SCR becomes weakened and fails. Another problem with the SCR systems is that a specific capacitor arrangement is needed in order to make the forced commutation occur. The result of these added capacitors is a significant loss of power. The ultrasonic generator as developed by the inventors herein, requires a small amount of capacitance and thus is more reliable than the commonly used SCR-based systems. For example, the inventors herein have compared the novel IGBT-based generator with one that uses the prior art SCR technology, and report that the while the SCR-based system for the ultrasonic probe required a total input of about 3800 Watts, the ultrasonic generator in accordance with the embodiments of the present invention produces better results with the ultrasonic probe using only 2800 Watts. In addition to being more efficient than the commonly used SCR systems, the components, namely the IGBTs, in the generator are less costly and more readily available than the SCRs.

The ultrasonic generator in accordance with the embodiments of the present invention uses an IGBT rather than an SCR. The IGBT serves as an amplifier to magnify a pulse signal sent to the gates of the IGBT. The pulse sent to the gates of the IGBT is created from a variable pulse width generator. In one embodiment, this pulse width generator uses a variable frequency triangle waveform generator whose signal is sent to a comparator circuit with a variable reference voltage. The result is that by adjusting the reference voltage in the comparator circuit, the pulse width changes. This portion (e.g., the variable pulse width generator) of the generator is sometimes used with IGBTs to control A.C. motors. The variable frequency/pulse width signal is sent to the gates of the IGBT to be magnified. Variable voltage (e.g., in the range between 0-600 VDC) is delivered across the collector and emitter of the IGBT after the signal is delivered. The output of the IGBT is then a square waveform with a voltage of +/−600V. This voltage is sent to a coil wound around the ultrasonic transducer. The voltage creates a magnetic field on the transducer and the magnetorestrictive properties of the transducer cause the transducer to vibrate as a result of the magnetic field.

The power driving circuit for the ultrasonic transducer in accordance with the embodiments of the present invention represents an innovation over previous driving circuits for ultrasonic transducers. In the circuit, the power components include matched IGBTs in a full bridge power configuration. As used herein, a full bridge includes two half-bridge push pull amplifiers. Each half bridge is driven by an asymmetrical rectangular pulse train. The two pulse trains, that drive the full bridge are 180 degrees out of phase and inverted. The symmetry (e.g., percent of positive and negative pulse components) of the pulses that drive each half bridge section can be configured for any desired ultrasound output power.

The IGBT-based driving circuit in accordance with the embodiments of the present invention is described below in further detail. The IGBT circuit includes the following main components, namely: a DC power source; an IGBT; a Gate Driving Circuit; and a Closed Loop Current Sensing Circuit. Each of these components is described in further detail below.

DC Power Source

The DC power source as used herein may be any power source which rectifies and filters standard (e.g., 60 Hz) AC voltage to be a DC voltage. Generally this power conversion is accomplished by increasing the line frequency by use of a thyristor or other such device. The high frequency AC is then rectified and filtered using a capacitor tank and/or a DC choke to eliminate AC ripple. The DC power source needs sufficient power to operate the largest load that the ultrasonic probe may encounter. Typically a DC voltage of up to 0-600V is suitable with an ampere rating of 50 A giving a maximum of 30 kW. Larger systems may be used producing voltages of up to 1200V, however the maximum voltage rating of the IGBT, which is typically 1200V, needs to be taken into consideration.

The DC power source is ideally connected to the IGBT through a polar capacitor bank with a large value in order to reduce switching spikes due to the extremely high operating frequencies and high voltages. The DC capacitor is sufficiently rated to handle the maximum voltage in the system and any voltage spike that may occur.

The DC power source preferably has a variable voltage control to allow for voltage adjustment during different loading conditions. Also, the voltage adjustment will allow for the opportunity to run an ultrasonic transducer at a lower power level, if desired. In one embodiment, the voltage regulation can be a simple potentiometer style with a manual interface. Alternatively, the voltage regulation is achieved via an analog voltage or current applied to a sensor circuit, or a digitally programmed interface. It is also preferable for the power source to have a maximum current limit control which will prevent the system from overloading.

Isolated Gate Bipolar Transistor

An IGBT is used to invert a DC voltage into a pulsed bipolar rectangular waveform. IGBTs are most commonly used for motor control in variable frequency drives. The operation of an IGBT is similar to most other transistors in that a bus voltage is applied to the collector and emitter, while a signal is applied to its gate. The DC bus is then pulsed at the applied bus voltage and frequency and duty cycle of the gate signal.

An IGBT for use with a magnetostrictive transducer, such as exists in assignee's technology, can be sized depending on the loads on the transducer. During switching of the IGBT, large current spikes exist due to the magnetostrictive load being highly inductive. Thus, the IGBT used is often highly over rated for these current spikes. For example, a typical magnetostrictive transducer may require 9-10 Amps RMS. However, the current spikes may be as high as 300 Amps for only 1-2 microseconds during switching. Thus, a suitable IGBT for this type of operation should have a current rating of 300 A and a peak current rating of 600 A.

IGBT Gate Driving Circuit

Figure 2:
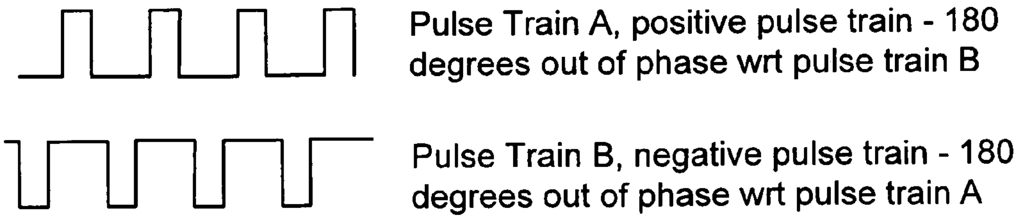
FIG. 2 shows two pulse trains, which are mutually inverted and 180 degrees out of phase that drive the expansion and contraction of magneto-constrictive ultrasonic transducer of FIG. 1.

An important aspect of the successful operation of the IGBT is the proper driving of its gate. Common methods for controlling IGBT gates used in motor control are not sufficient for operating the IGBT in use with a magnetostrictive ultrasonic probe. Generally, a motor control gate drive circuit attempts to simulate an alternating current similar to standard 50/60 Hz AC found in wall sockets. Thus, the IGBT is pulsed with a varying duty cycle at a very high frequency. At a low duty cycle (e.g., 10%) there is a small amount of current, then as the duty cycle increases the current also increases. When driving an IGBT for use with an ultrasonic probe a DC bias exists for successful operation. The amount of DC bias can be directly controlled in a full bridge system by varying the duty cycle of the various IGBT gates as shown in FIG. 2. The amount of DC bias will increase with a higher duty cycle of pulse train A which in turn decreases the duty cycle of pulse train B accordingly so that the 2 different pulses are not high at the same time.

In order to produce this type of gate driving, a waveform generator is used. The waveform generator can be any standard waveform generator which is capable of varying the frequency and/or duty cycle of the generated waveform. In one embodiment of the gate driving circuit, a triangle waveform generator is used. For example, the triangle waveform is produced by an 8038 triangle waveform generator. The 8038 chip allows for pulse width control of the in phase and quadrature IGBT control waveforms, which impacts the power management of the full bridge IGBT circuit. In one embodiment, the driving circuit uses this circuit with variable frequency control and variable pulse width control. The triangle wave is sent to two LF 353 comparators that compare a preset voltage to the positive and negative triangle waveforms to generator the in phase and quadrature control waveforms for the full bridge IGBT circuit. The quadrature control waveforms for the full bridge IGBT circuit are generated such that while the positive triangle wave is greater than the preset voltage a pulse width controlled rectangular wave is generated, and while the negative triangle wave is less than the preset voltage the quadrature control rectangular wave is generated. In an alternate embodiment, the power driving circuit uses the Global Specialties 2 MHz waveform generator. This waveform generator may also use the basic 8038 triangle waveform generator with positive and negative comparators.

FIG. 1 is a simplified circuit diagram showing a model of a full bridge IGBT circuit with a parallel resonant magneto-constrictive transducer according to one embodiment of the invention. As shown in FIG. 1, Q1, Q2, Q3, Q4 are the 4 IGBT that compose the full bridge circuit shown. D1, D2, D3, D4 are four protection diodes that prevent reverse current across the IGBT that would be damaging. L1 and L2 are the inductance of the windings of magneto-constructive transducer that is driven by the full bridge circuit. Only One winding is shown in the Full Bridge diagram of FIG. 1. C1 is a parallel capacitance that allows the magneto-constrictive to operate in resonance. However, in practice this capacitor can be left out because of small device parasitic capacitances that allow the magneto-constructive transducer to operate at resonance in the 15 KHz to 20 KHz region.

In operation, the full bridge circuit is driven by the gate driving pulse trains A and B, as shown in FIG. 2. The first pulse train (Train A) is applied to the gates of IGBT Q1 and Q4 and the second pulse train (Train B) is applied to the gates of IGBT Q2 and Q3.

As shown in FIG. 2, the two pulse trains, are mutually inverted and 180 degrees out of phase to drive the expansion and contraction of magneto-constrictive ultrasonic transducer. These signals are optical isolated from the IGBT gates by optocoupler gate driver. Other IGBT driver protection circuitry limits the gate voltage and blocks this signal when the collector to emitter voltage is too high. The gate driver circuit also includes a buffer amplifier that provides several amps driving current.

Figure 3:
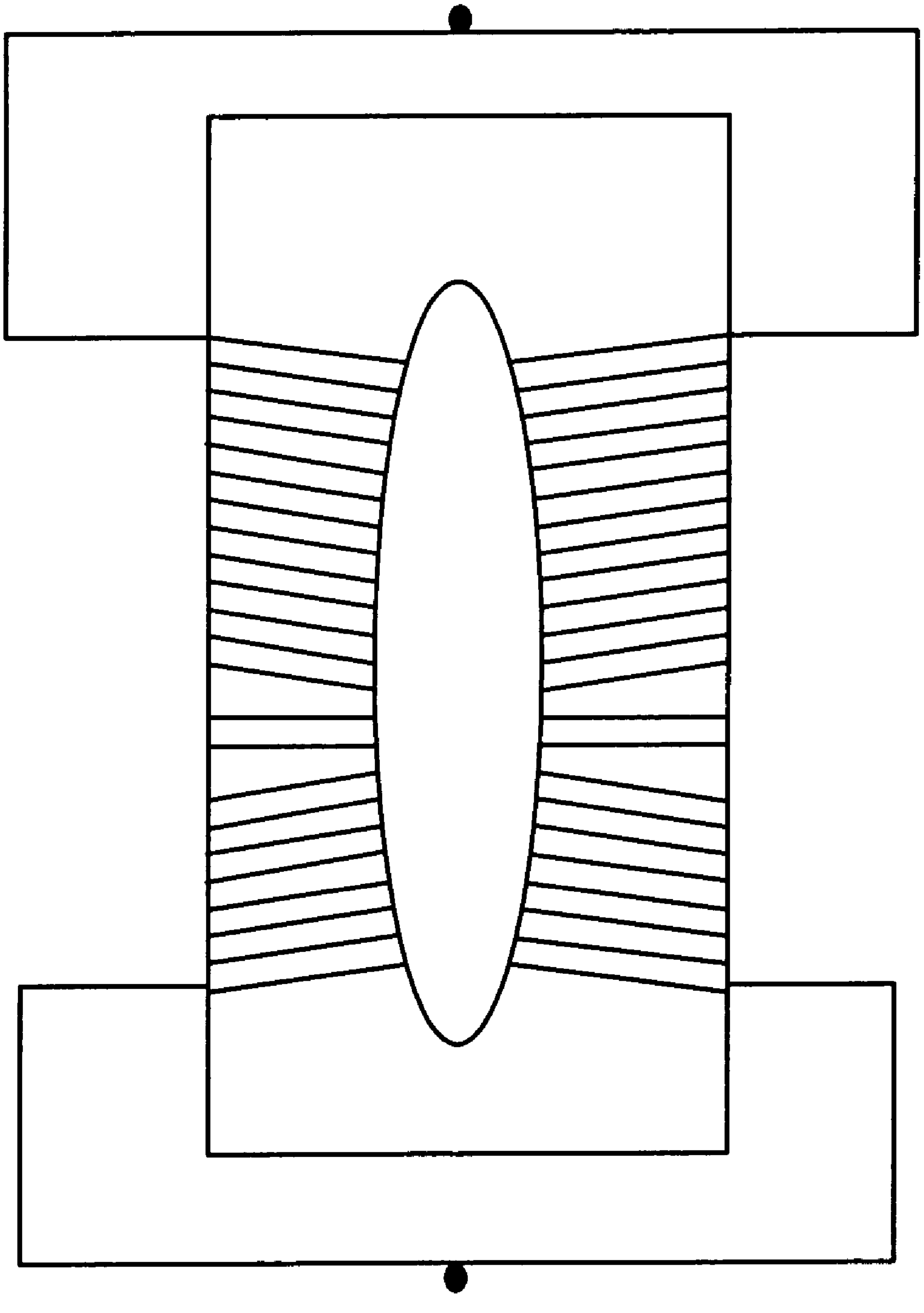
FIG. 3 is a simplified diagram of a side view of an oval windowed magneto-constrictive transducer.

FIG. 3 is a simplified diagram of a side view of an oval windowed magneto-constrictive transducer. Shown in FIG. 3 are the two windings that drive the ultrasonic magneto-constrictive transducer. These windings are driven in parallel by the IGBT power source at the optimum frequency of operation. The first output of the full bridge connects to the center-tap of the each half bridge on Q1 and Q3. The second output of the full bridge connects to the center tap outputs of the half bridges Q2 and Q4. For this power pulse configuration the magnetic flux through the magneto-constructive torroidal ring is in phase. For the configuration shown in FIG. 3, the two windings are in opposite senses.

In operation, the circuit of FIGS. 1-3 enable a new method of driving the ultrasonic transducer. The full bridge method of driving the ultrasonic transducer is shown in FIGS. 1, 2 and 3. The two half bridge circuits of the full bridge IGBT system each drive the transducer magneto-constrictive material to a contracted state (negative pulse) and to an expanded state (Positive Pulse). Other safety components included in the full bridge design and not shown in FIG. 1 are input snubber capacitors across the DC power input to the two half bridge IGBT circuits as shown in FIG. 1. In the circuit of FIG. 1, IGBT are the solid state device of choice for the Low Frequency region of 15 KHz to 20 KHz. Alternately, Mosfet devices are used in the 200 KHz to 300 KHz regions for ultrasonic chemical processing.

Because the IGBT relies on rectangular power pulses, the fast current changes in the inductor produce L*dI/dT caused voltage spikes. The problem of high voltage spikes requires IGBT with high voltage capacities above the average operating voltage in the resonant transducer circuit. While the full bridge parallel resonant driver is more power efficient than the SCR driven ultrasonic transducer, it produces spikes, while an SCR-based system does not produce voltage spikes. This is because the SCRs are only actively triggered in the positive state and are turned off in the commutation mode where the transducer resonates in the commutative mode.

Figure 4:
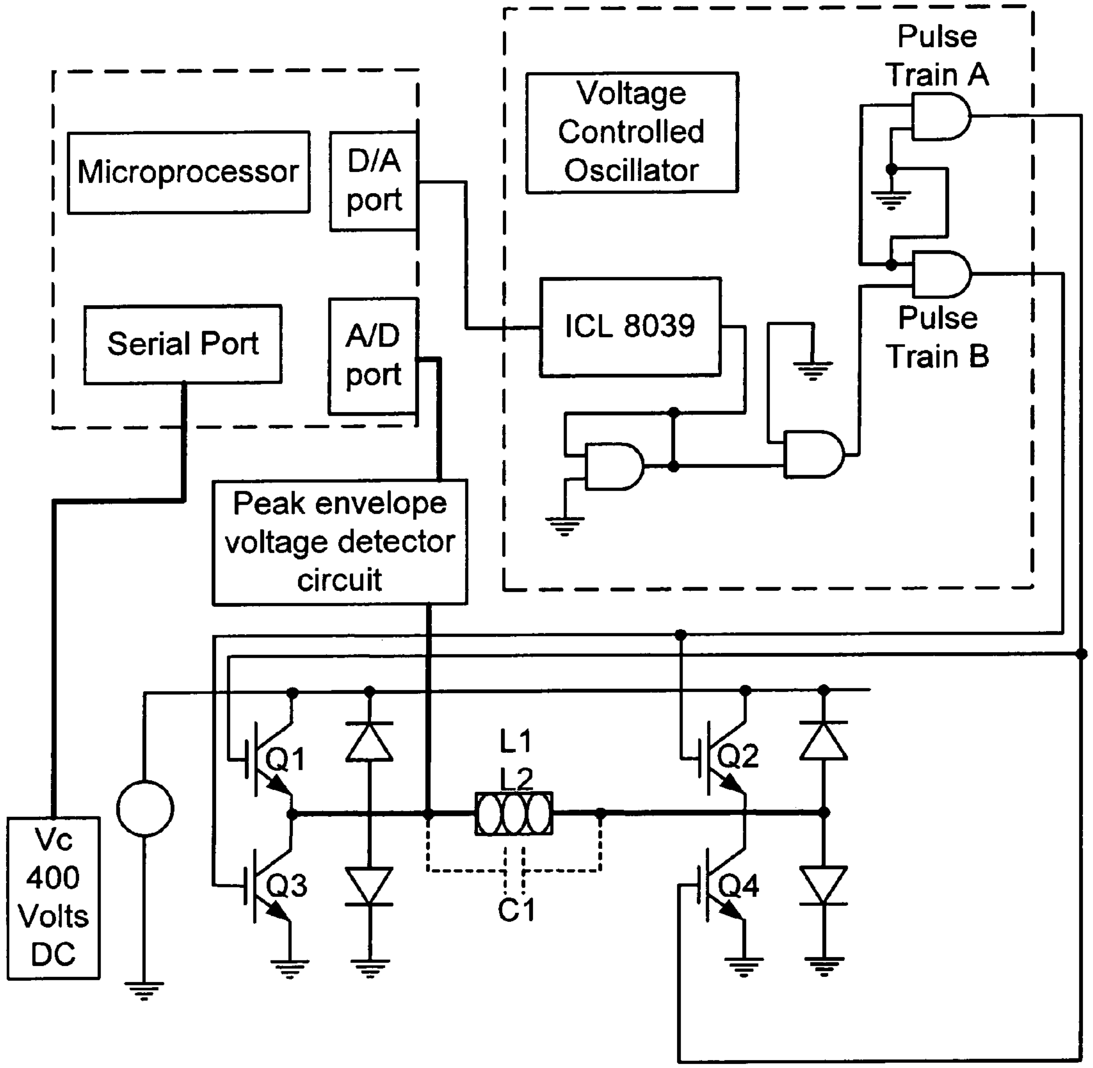
FIG. 4 is a simplified circuit diagram for a system implementing the full bridge IGBT driving circuit of FIG. 1, where a microprocessor outputs a voltage corresponding to the operating frequency of the voltage controlled oscillator (VCO), according to one embodiment of the present invention.

FIG. 4 is a simplified circuit diagram for a system implementing the full bridge IGBT driving circuit of FIG. 1, where a microprocessor outputs a voltage corresponding to the operating frequency of the voltage controlled oscillator (VCO), according to one embodiment of the invention. The microprocessor scans over the operating frequency range and records through the serial port connection to the DC power generator the corresponding RMS current in amperes going to the ultrasonic transducer. After scanning over the frequency range (e.g., from 16 KHz to 18 KHz) and recording the power current at each step, the microprocessor selects the voltage corresponding to maximum power and locks in this operating frequency value. In a batch reactor this optimization process takes place at the beginning of each batch cycle. After the operating frequency is set, the peak resonant voltage is set to a point below the IGBT breakdown voltage by raising or lowering the pulse train duty cycle.

In operation, the circuit of FIG. 4 enables a new method of controlling the operating frequency of an ultrasonic magneto-constrictive transducer to respond to changes in characteristics of the magneto-constrictive material, in response to temperature changes in the ultrasonic reactor. This control scheme uses a microprocessor with D/A and A/D capacities. In another embodiment, instead of the microprocessor, a Programmable Logic Controller (PLC) is used. The microprocessor or controller samples (Through A/D port) the maximum voltage, or peak envelope, voltage. The peak envelope voltage is used by the microprocessor to control the average driving power pulse width. The on time of the positive and negative pulse trains in FIG. 2 are limited so the voltage spikes do not go over the limiting breakdown voltage of the IGBT. In order to set the resonate transducer frequency, the average DC input current is read through the serial port of the DC power generator by the serial port of the microprocessor or PLC. In one embodiment, the maximum RMS current of the deflection transducer or passive magneto-constrictive element is read as the operating frequency is scanned to optimize the ultrasonic vibration frequency. Preferably, the microprocessor or controller scans the operating frequency region for 16 KHz to 18 KHz by increasing the voltage controlled Oscillator output voltage (through the d/a port). At each scanning frequency the RMS current in amperes is sensed and recorded through the serial port. After the operating frequency is set the pulse width can be raised or lowered so the resonant voltage does not go over the IGBT breakdown voltage.

Figure 5:
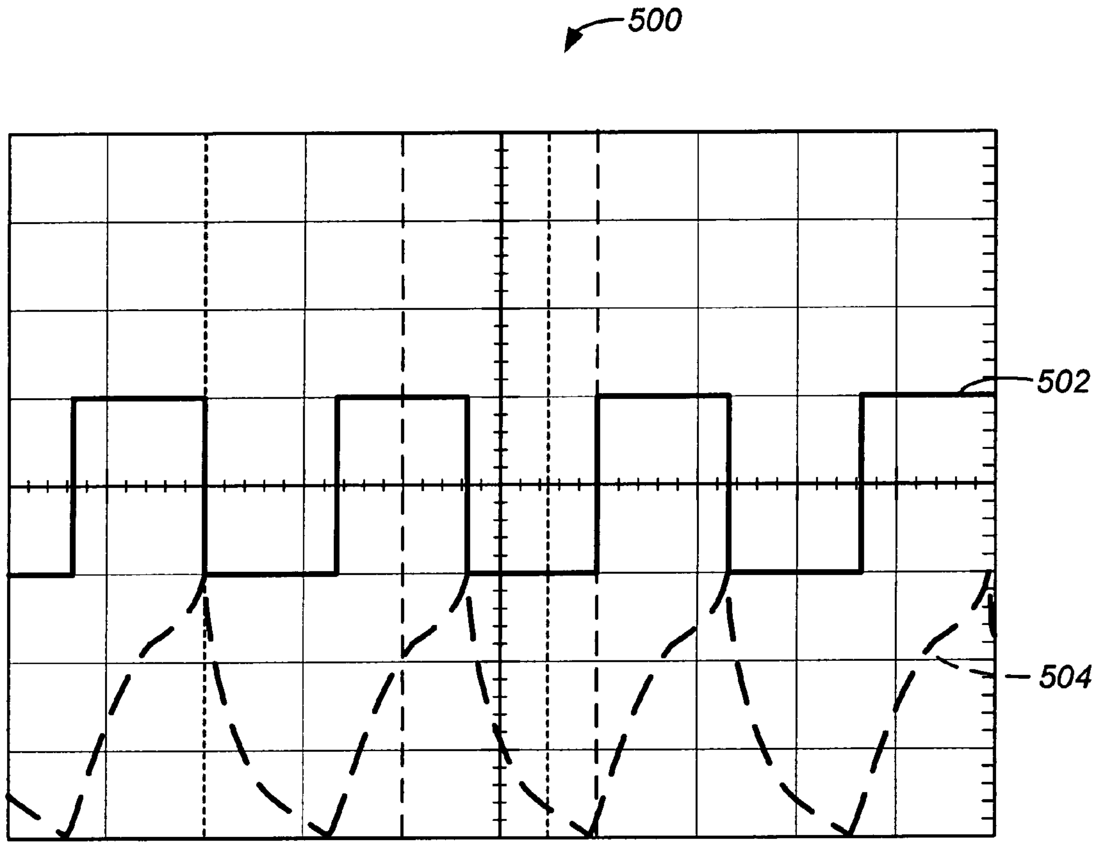
FIG. 5 is a graph of an exemplary output power waveform produced by the power driving circuit of FIG. 4.

FIG. 5 is a graph 500 of an exemplary output power waveform produced by the power driving circuit in accordance with the embodiments of the present invention. The square wave 502 shows the 0 to 400 volts that is drawn from the microprocessor controlled DC voltage supply. +200 and −200 volts are drawn by each side of the Full Bridge power circuit. The lower wave form 504 shows the total real and reactive current wave form. The reactive component of the current waveform can be found from the equation V=L*di/dt, where L is the inductance of the double coils wound on the looped magnetostrictive magnets. The total RMS current drawn is 20 Amps. This current gives the total real power of approximately 4 KWatt. The wave form shows current of 0 to 60 amps. The reactive current goes into the reactive power that is used to maintain the vibrations in the magnetostrictive laminated core and in the transducer base and wear tip. The loss in the core is caused by eddy current losses. For the 2-inch core consisting of 500 4 mil laminations, the total loss in approximately 300 Watts, that is lost as Heat. The real losses in the transducer base and wear tip occur from the power required to act against gravity and the mechanical loss in the base and wear tip, that also contribute to the lost heat.

In one embodiment, the voltage controlled oscillator is based on an 8038 chip which generates a full cycle square wave with positive and negative rectangular components. The output from the voltage controlled oscillator is separated into two positive and negative pulse trains as shown in FIG. 2 by passing the full cycle wave into positive and negative powered operational amplifiers using two fast LF353 chips. Inverting and non-inverting amplifiers raise the peak positive and negative pulse voltage to the 15 volts required by the four IGBTs. Alternately, a commercial waveform generator that is accessible to computer control by the RS 232 port can be used in a power optimization scheme instead of the VCO.

In an alternate embodiment, a VCO is not used. Instead of a VCO, a Hall effect sensors detect the positive and negative going zero current crossings. At the positive current crossing a Positive pulse is sent to the base of Q1 and Q4 in FIGS. 1 and 4 at the negative going zero current crossing a negative pulse is sent to the base of the Q2 and Q3 IGBTs.

As will be understood by those skilled in the art, other equivalent or alternative methods and circuits for driving a high-power and variable-load ultrasonic transducer according to the embodiments of the present invention can be envisioned without departing from the essential characteristics thereof For example, the IGBT gates may be driven by a pulse train produced by any suitable wave generating device or system as described above. Accordingly, the foregoing disclosure is intended to be illustrative, but not limiting, of the scope of the invention which is set forth in the following claims.

What is claimed is:

1. An ultrasonic generator for delivering high-power ultrasonic energy to a varying load, comprising:
- a variable frequency waveform generator;
- a pulse width modulator coupled with said waveform generator and configured to provide an output signal;
- an isolated gate bipolar transistor (IGBT), having a gate that is coupled with the output of said pulse width modulator,
- a voltage source coupled across the collector and emitter of said IGBT, said IGBT configured to amplify the output signal from said pulse width modulator to produce an amplified signal; and
- a magnetostrictive transducer having a coil configured to receive the amplified signal, so as to deliver high-power ultrasonic energy to a varying load.

2. The ultrasonic generator of claim 1 wherein the variable frequency waveform generator generates a triangular waveform.

3. The ultrasonic generator of claim 1 wherein said insulated gate bipolar transistor is a first insulated gate bipolar transistor, and wherein said ultrasonic generator further comprises a full-bridge circuit having two half-bridge circuits, each half-bridge circuit comprising two matched insulated gate field effect transistors, the full-bridge circuit being coupled between the voltage source and the magnetostrictive transducer, and wherein one of said half-bridge circuits comprises said first insulated gate bipolar transistor.

4. The ultrasonic generator of claim 3 wherein said pulse width modulator generates two pulse train signals that are 180 degrees out of phase and inverted with respect to one another, and wherein each pulse train signal is coupled to a respective insulated-gate bipolar transistor of each half-bridge circuit.

5. The ultrasonic generator of claim 4 wherein at least one of the pulse train signals comprises asymmetric rectangular pulse train.

6. The ultrasonic generator of claim 1 wherein said voltage source comprises a variable voltage regulated DC source.

7. The ultrasonic generator of claim 1 further comprising a microprocessor, and
- wherein the variable frequency waveform generator comprises a voltage-controlled oscillator coupled to the microprocessor to receive a signal that sets its oscillation frequency to a corresponding value within the oscillator's operating frequency range;
- wherein the voltage source is coupled to the microprocessor and provides it with a representation of the RMS current going to the transducer; and
- wherein the microprocessor outputs signals to the voltage-controlled oscillator to scan over the oscillator's operating frequency range at a plurality of steps, wherein the microprocessor records the representations of the corresponding RMS currents going to the transducer at each said step, and wherein the microprocessor thereafter outputs a signal to the voltage-controlled oscillator to select the oscillation frequency corresponding to maximum power going to the transducer.

8. The ultrasonic generator of claim 1 wherein the pulse width modulator generates an asymmetric rectangular pulse train.

9. The ultrasonic generator of claim 8 wherein the duty cycle is limited so that voltage spikes at the insulated gate bipolar transistor do not go over the limiting breakdown voltage of the insulated gate bipolar transistor.

10. The ultrasonic generator of claim 1 further comprising:

a microprocessor; and a peak envelope voltage detection circuit coupled to the isolated gate bipolar transistor and the microprocessor to provide the microprocessor with a representation of a peak voltage at the insulated gate bipolar transistor; and wherein the pulse width modulator is coupled to the microprocessor to receive a signal to control a duty cycle of the modulator; and wherein the microprocessor outputs a signal to the pulse width modulator to control the modulator's duty cycle in relation to a received representation of a peak voltage at the insulated gate bipolar transistor.

* * * * *